(12) United States Patent
Gill et al.

(10) Patent No.: US 9,407,090 B1
(45) Date of Patent: Aug. 2, 2016

(54) DETECTION OF A SILENT FAILURE OF A SURGE PROTECTION DEVICE

(71) Applicant: Juniper Networks, Inc., Sunnyvale, CA (US)

(72) Inventors: Jaspal S. Gill, Tracy, CA (US); David K. Owen, Livermore, CA (US); Michael Braylovskiy, San Mateo, CA (US); Muhammad Sagarwala, Los Gatos, CA (US)

(73) Assignee: Juniper Networks, Inc., Sunnyvale, CA (US)

(*) Notice: Subject to any disclaimer, the term of this patent is extended or adjusted under 35 U.S.C. 154(b) by 306 days.

(21) Appl. No.: 14/037,857

(22) Filed: Sep. 26, 2013

(51) Int. Cl.
*H02H 9/04* (2006.01)
*G01R 31/28* (2006.01)

(52) U.S. Cl.
CPC ........... *H02H 9/042* (2013.01); *G01R 31/2827* (2013.01)

(58) Field of Classification Search
CPC .......................................... H02H 9/042–9/043
USPC ......................................................... 361/120
See application file for complete search history.

(56) References Cited

U.S. PATENT DOCUMENTS

| 6,535,369 B1* | 3/2003 | Redding ................ H01C 7/126 361/111 |
| 2011/0267730 A1* | 11/2011 | Brand ..................... H02H 9/04 361/91.2 |

* cited by examiner

*Primary Examiner* — Stephen W Jackson
*Assistant Examiner* — Christopher Clark
(74) *Attorney, Agent, or Firm* — Harrity & Harrity, LLP

(57) ABSTRACT

A secondary protection device may receive a voltage surge. The voltage surge may be received based on a failure associated with a primary protection device. The secondary protection device may protect a piece of protected equipment from the voltage surge based on receiving the voltage surge. The secondary protection device may generate a failure notification based on protecting the piece of protected equipment from the voltage surge. The failure notification may indicate the failure associated with the primary protection device. The secondary protection device may provide the failure notification.

20 Claims, 8 Drawing Sheets

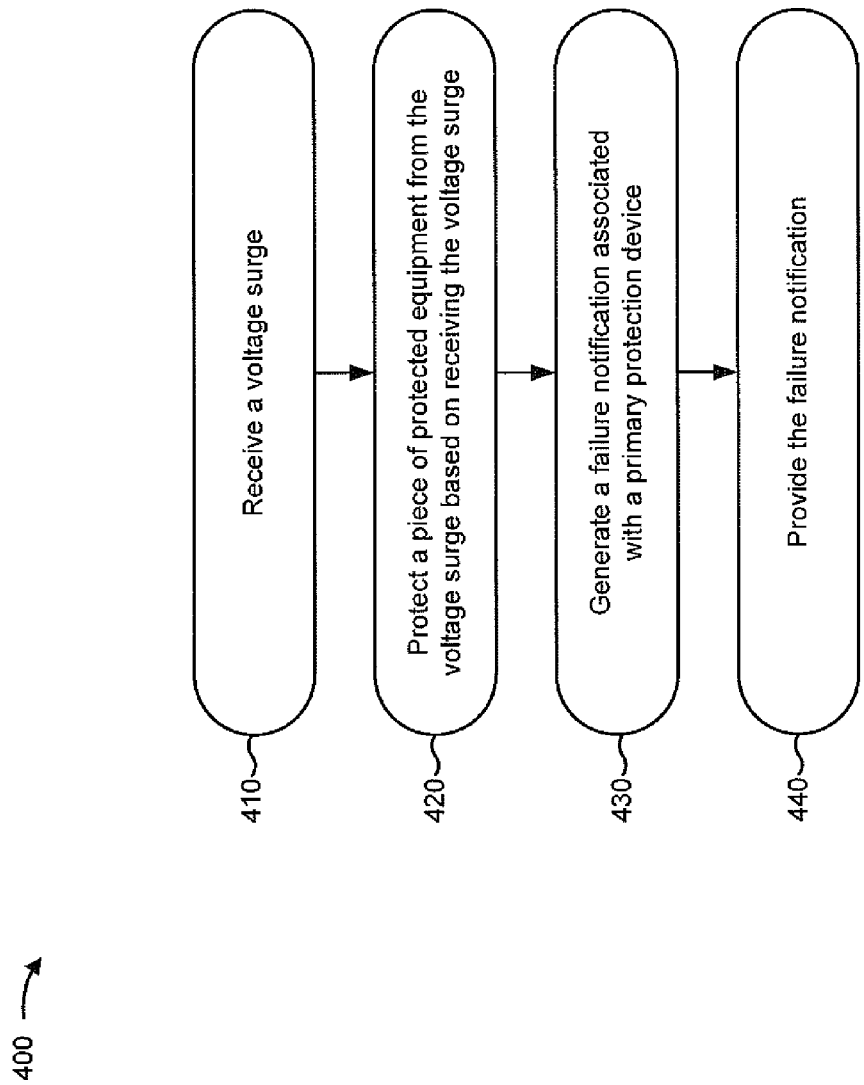

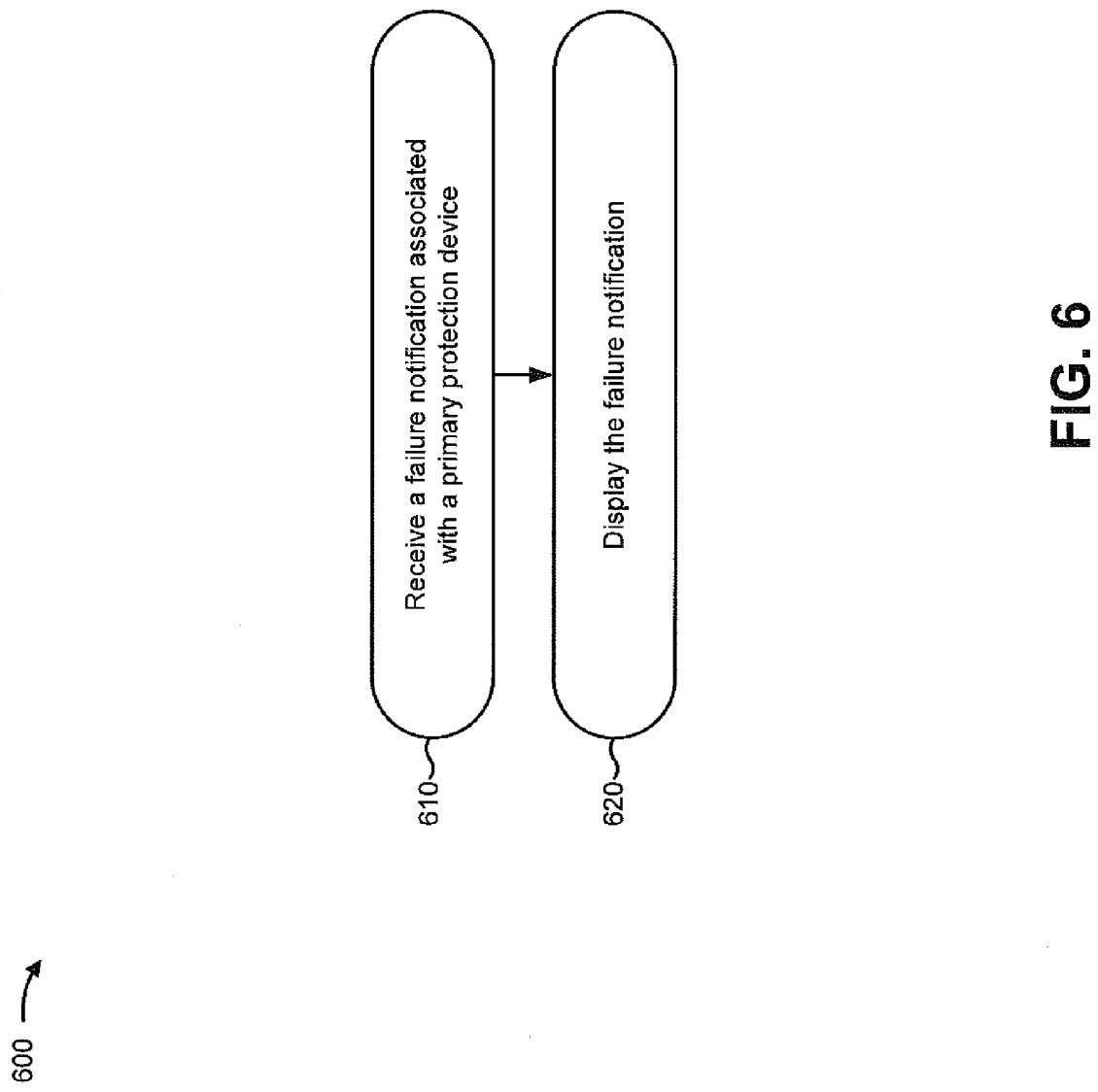

US 9,407,090 B1

DETECTION OF A SILENT FAILURE OF A SURGE PROTECTION DEVICE

BACKGROUND

A surge protection device is a device designed to protect a piece of protected equipment from a surge event (e.g., a voltage surge) by limiting a quantity of voltage that is supplied to the protected equipment (e.g., by blocking the voltage, by shorting the voltage, by diverting the voltage, etc.). One example of a surge protection device is a gas discharge tube ("GDT"). A GDT is a device that contains a gas mixture held between two electrodes. The gas mixture may be ionized by the surge event (e.g., when the voltage surge triggers the GDT), which may allow the GDT to create an effective short circuit, thereby protecting the protected equipment from the surge event.

SUMMARY

According to some possible implementations, a secondary protection device may include one or more processors to: receive a voltage surge, where the voltage surge may be received based on a failure associated with a primary protection device; protect a piece of protected equipment from the voltage surge based on receiving the voltage surge; generate a failure notification based on protecting the piece of protected equipment from the voltage surge, where the failure notification may indicate the failure associated with the primary protection device; and provide the failure notification.

According to some possible implementations, a method may include: detecting, by a secondary protection device, a voltage surge, where the voltage surge may be detected based on a failure associated with a primary protection device; protecting, by the secondary protection device, one or more protected components from the voltage surge; generating, by the secondary protection device, a failure notification based on protecting the one or more protected components, where the failure notification may include information that indicates that the primary protection device has failed; and outputting, by the secondary protection device, the failure notification.

According to some possible implementations, a system may include a primary protection device and a secondary protection device to: receive a surge event based on a failure associated with the primary protection device; protect a group of protected components from the surge event based on receiving the surge event; produce a failure notification based on protecting the group of protected components, where the failure notification may include information indicating the failure associated with the primary protection device; and provide a visual or audible output associated with the failure notification, where the visual or audible output may be provided to a user associated with the primary protection device.

BRIEF DESCRIPTION OF THE DRAWINGS

FIG. 4 is a flow chart of an example process for generating and providing a failure notification associated with a primary protection device;

FIG. 6 is a flow chart of an example process for receiving and displaying a failure notification associated with a primary protection device.

DETAILED DESCRIPTION

The following detailed description of example implementations refers to the accompanying drawings. The same reference numbers in different drawings may identify the same or similar elements.

A protection device (e.g., a GDT) may be connected to a power supply to protect a piece of protected equipment (e.g., a piece of equipment connected to the power supply) from a surge event (e.g., a voltage surge). However, the protection device may eventually fail to protect the protected equipment. For example, the protection device may fail after protecting the protected equipment from a threshold quantity of surge events (e.g., when an amount of the gas mixture contained within a GDT is exhausted after protecting the equipment from the threshold quantity of surge events). As another example, the protection device may fail because of damage to the protection device (e.g., when the GDT is cracked, when the gas mixture leaks from the GDT, when electrodes within the GDT are damaged, etc.). The protection device may fail without providing any indication that the protection device has stopped protecting the equipment (e.g., a silent failure). As such, there may be no indication or warning that the protection device will not protect the equipment when the next surge event occurs, which may lead to damage to the equipment. Implementations described herein may allow a secondary protection device to provide, to a user associated with a piece of protected equipment, information indicating a failure of a primary protection device associated with the protected equipment.

Figure 1:
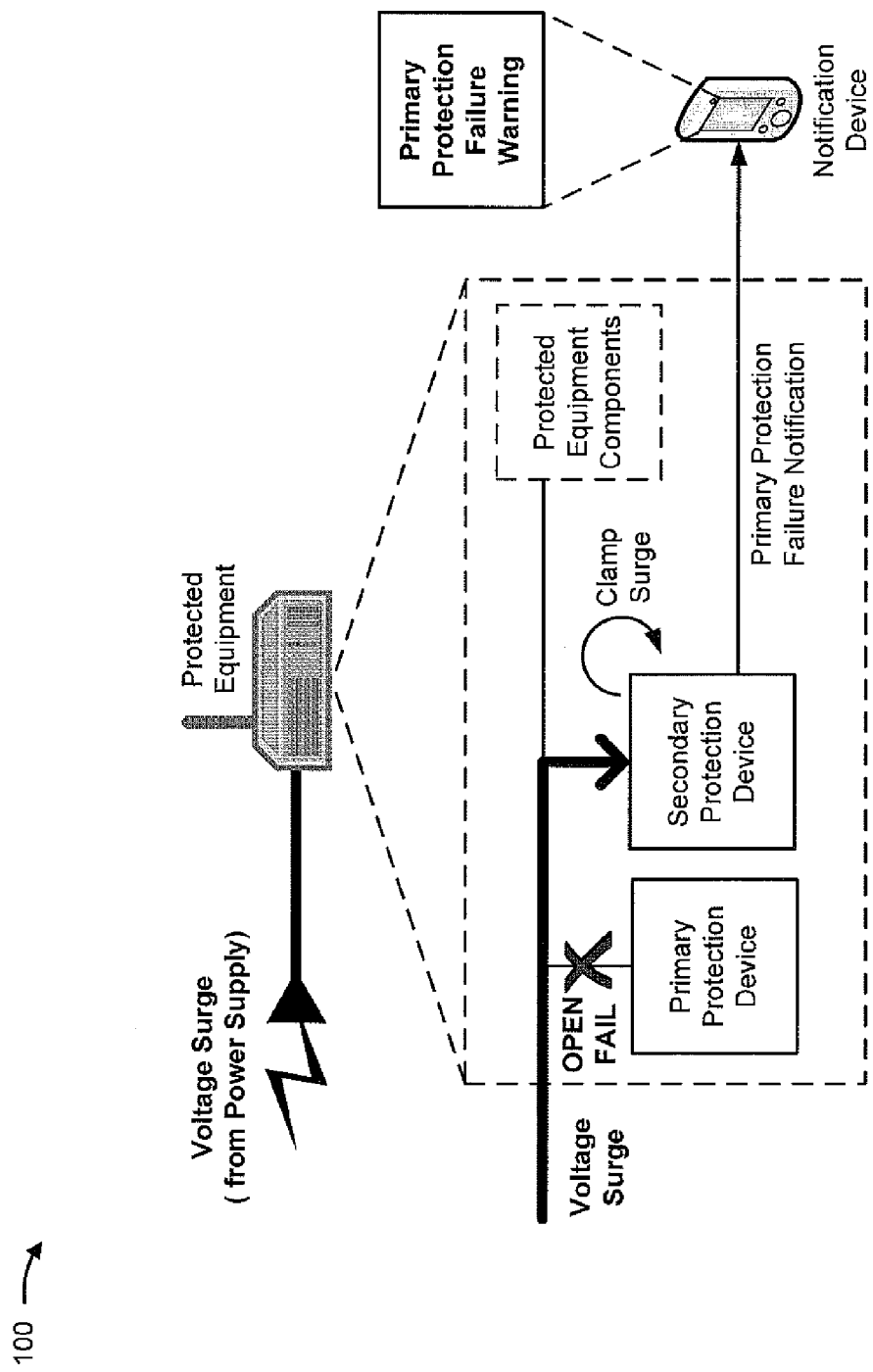
FIG. 1 is a diagram of an overview of an example implementation described herein.

FIG. 1 is a diagram of an overview of an example implementation 100 described herein. For the purposes of FIG. 1, assume that a piece of protected equipment is connected to a power supply. Further, assume that the protected equipment contains a primary protection device, a secondary protection device, and protected equipment components (e.g., components of the protected equipment that are to be protected from a surge event).

As shown in FIG. 1, the protected equipment may receive a voltage surge from the power supply (e.g., a voltage surge that occurs due to a lightning strike, a voltage surge that occurs due to a power transition or failure in another piece of equipment, etc.). As further shown, the primary protection device, included in the protected equipment, may fail (e.g., an open failure) to protect the equipment from the voltage surge (e.g., no current may flow to the primary protection device because the primary protection device is damaged, etc.).

As further shown in FIG. 1, the secondary protection device may protect the equipment from voltage surge based on the failure of the primary protection device to protect the equipment from the voltage surge (e.g., when the secondary protection device is not to protect the equipment from the voltage surge when the primary protection device is operating properly). As further shown, the secondary protection device may generate and provide a failure notification to a notification device associated with the protected equipment (e.g., based on the secondary protection device clamping the voltage surge). As shown, the failure notification may include information indicating that the primary protection device has failed. As further shown, the notification device may display information associated with the failure notification (e.g., to inform a user that the primary protection device has failed). In this way, a secondary protection device may protect a piece of protected equipment from a surge event, and may inform a user, associated with the protected equipment, that a primary protection device has failed (e.g., to inform the user that the primary protection device is to be replaced).

Figure 2:
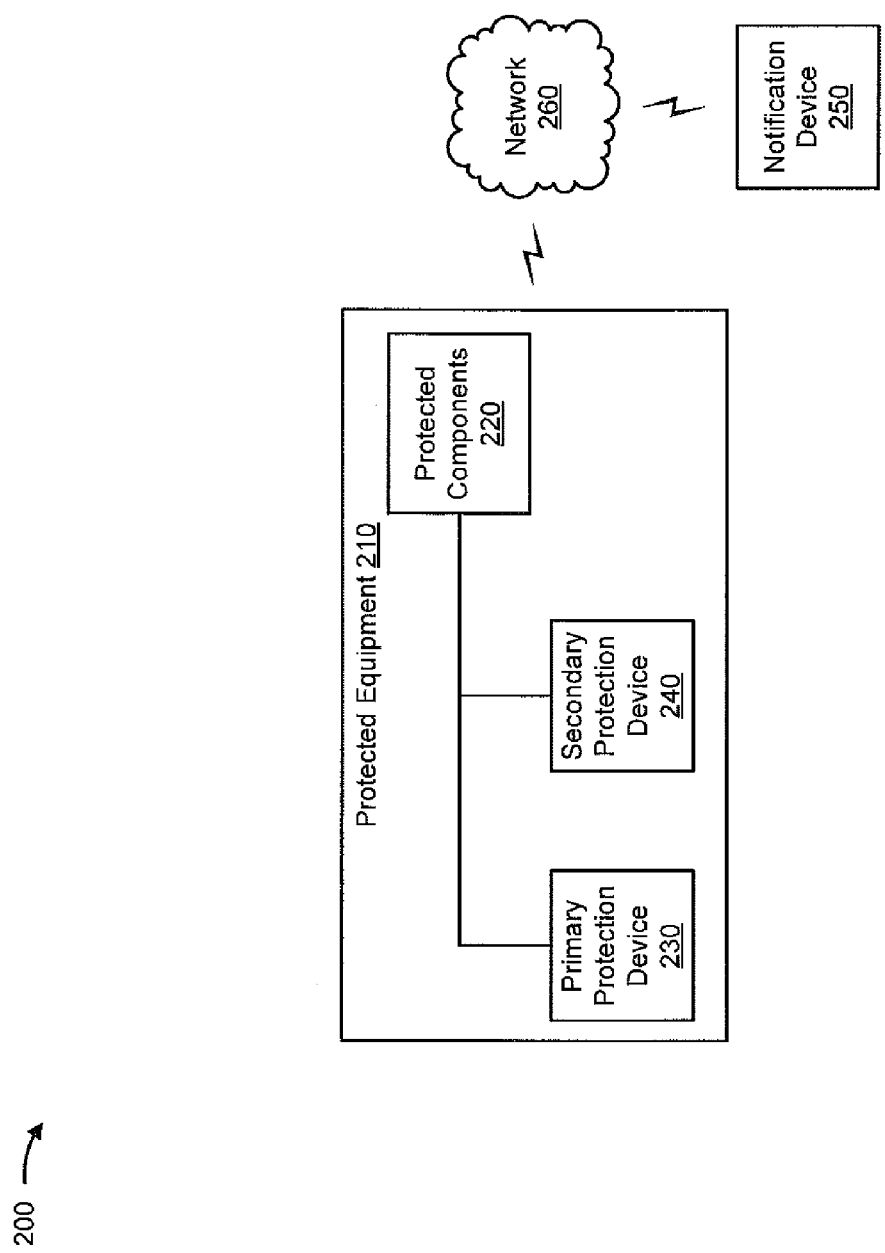
FIG. 2 is a diagram of an example environment in which systems and/or methods, described herein, may be implemented.

FIG. 2 is a diagram of an example environment 200 in which systems and/or methods described herein may be implemented. As shown in FIG. 2, environment 200 may include a piece of protected equipment 210, a group of protected components 220, a primary protection device 230, a secondary protection device 240, a notification device 250, and a network 260.

Protected equipment 210 may include a piece of equipment that is to be protected by primary protection device 230 and/or secondary protection device 240. For example, protected equipment 210 may include a user device (e.g., a desktop computer, a laptop computer, a mobile device, a gaming device, etc.), a network device (e.g., a router, a gateway, a firewall, a server, an access point, etc.) or another type of device. In some implementations, protected equipment 210 may include primary protection device 230, secondary protection device 240, and/or protected components 220 (e.g., components that are to be protected by primary protection device 230 and/or secondary protection device 240). In some implementations, protected equipment 210 may be separate from and connected to primary protection device 230 and secondary protection device 240. In this case, primary protection device 230 and secondary protection device 240 may be implemented with a surge protector device to which protected equipment 210 connects.

Primary protection device 230 may include a device that is to protect protected components 220 included in protected equipment 210 from a surge event (e.g., a voltage surge). In some implementations, primary protection device 230 may protect protected components 220 when primary protection device 230 receives a surge event (e.g., a voltage surge) that satisfies a first threshold (e.g., a voltage surge exceeding a first threshold quantity of kilovolts ("kV")). In some implementations, primary protection device 230 may be connected to secondary protection device 240.

Secondary protection device 240 may include a device that is to protect protected components 220 included in protected equipment 210 from a surge event when primary protection device 230 fails to protect protected components 220 from the surge event. In some implementations, secondary protection device 240 may protect protected components 220 when secondary protection device 240 receives a surge event that satisfies a second threshold (e.g., a voltage surge exceeding a second threshold quantity of kilovolts). In some implementations, secondary protection device 240 may include a device capable of generating and providing a failure notification based on detecting a surge event and/or protecting protected components 220 from the surge event. In some implementations, secondary protection device 240 may be connected to notification device 250 via network 260.

Notification device 250 may include a device capable of receiving and providing a failure notification associated with primary protection device 230. For example, notification device 250 may include a smart phone, a desktop computer, a laptop computer, a tablet computer, and/or a similar device (e.g., when notification device 250 is not included in protected equipment 210). As an additional example, notification device 250 may include a device associated with providing an output (e.g., a light-emitting diode ("LED"), a warning light, a display device, a speaker, etc.) that is to provide output to a user regarding the failure of primary protection device 230 (e.g., when notification device 250 is included in or otherwise connected to protected equipment 210). In some implementations, notification device 250 may be connected to protected equipment 210 via network 260.

Network 260 may include one or more wired and/or wireless networks that may connect protected equipment 210 (e.g., protected components 220) and/or notification device 250. In some implementations, a portion of network 260 may allow secondary protection device 240 to transmit information, associated with a failure notification, to notification device 250. In this case, network 260 may include a bus, a local area network, a wireless local area network, a wide area network, or the like.

The number of devices and networks shown in FIG. 2 is provided for explanatory purposes. In practice, there may be additional devices and/or networks, fewer devices and/or networks, different devices and/or networks, or differently arranged devices and/or networks than those shown in FIG. 2. Furthermore, two or more of the devices shown in FIG. 2 may be implemented within a single device, or a single device shown in FIG. 2 may be implemented as multiple, distributed devices. Additionally, one or more of the devices of environment 200 may perform one or more functions described as being performed by another one or more of the devices of environment 200. Devices of environment 200 may interconnect via wired connections, wireless connections, or a combination of wired and wireless connections.

Figure 3:
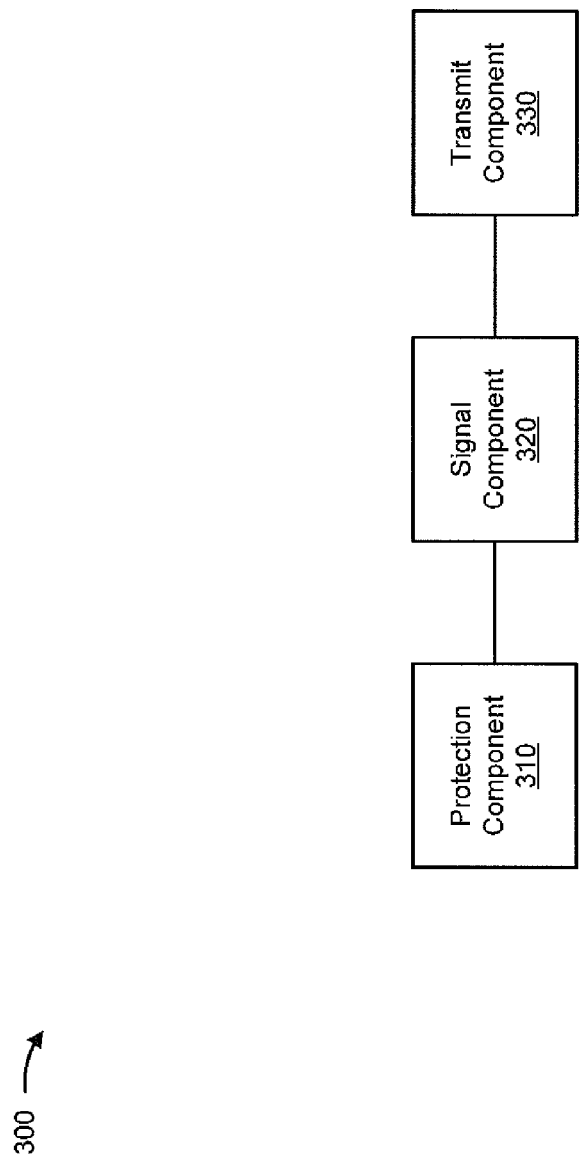
FIG. 3 is a diagram of example components of one or more devices of FIG. 2.

FIG. 3 is a diagram of example components of a device 300. Device 300 may correspond to secondary protection device 240. Additionally, or alternatively, secondary protection device 240 may include one or more devices 300 and/or one or more components of device 300. As shown in FIG. 3, device 300 may include a protection component 310, a signal component 320, and a transmit component 330. As shown in FIG. 3, signal component 320 may connect to both protection component 310 and transmit component 330.

Protection component 310 may include a component that is to protect protected equipment 210 (e.g., including protected components 220) from a surge event (e.g., a voltage surge). For example, protection component 310 may include a GDT, or another type of surge protection component. In some implementations, protection component 310 may protect protected equipment 210 by clamping a voltage surge associated with the surge event. Additionally, or alternatively, protection component 310 may protect protected equipment 210 by diverting a current associated with the surge event. In some implementations, protection component 310 may be a device capable of protecting protected equipment 210 from a limited quantity of surge events (e.g., a GDT may protect protected equipment 210 until the gas contained within the GDT has dissipated). In some implementations, protection component 310 may cause an electrical signal, associated with protecting protected equipment 210, to be sent to signal component 320.

Signal component 320 may include a component that may receive an electrical signal from protection component 310 (e.g., when protection component 310 has protected protected equipment 210 from a surge event), and may transfer the electrical signal to transmit component 330. For example, signal component 320 may include a current transformer, a photocoupler, a Reed relay, or another device. In some implementations, signal component 320 may also include one or more components associated with transferring the electrical signal to transmit component 330, such as a diode (e.g., a Zener diode), a resistor, a capacitor, or another type of component used to transfer and/or provide an electrical signal. In some implementations, the electrical signal received and/or transferred by signal component 320 may be used to indicate that protection component 310 has been activated (e.g., to indicate that protection component 310 has protected protected equipment 210 from a voltage surge).

Transmit component 330 may include a component that generates a failure notification based on receiving an electrical signal, and transmits the failure notification. For example, transmit component 330 may include a microcontroller and/or a logic circuit that receives an electrical signal, and generates a failure notification based on receiving the electrical signal. In some implementations, transmit component 330 may receive an electrical signal from signal component 320, and may generate a failure notification indicating that primary protection device 230 has failed. In some implementations, transmit component 330 may cause secondary protection device 240 to provide the failure notification to notification device 250.

The number of components shown in FIG. 3 are provided for explanatory purposes. In practice, device 300 may include additional components, fewer components, different components, or differently arranged components than those shown in FIG. 3.

FIG. 4 is a flow chart of an example process 400 for generating and transmitting a failure notification associated with a primary protection device. In some implementations, one or more process blocks of FIG. 4 may be performed by secondary protection device 240. In some implementations, one or more process blocks of FIG. 4 may be performed by another device or a group of devices separate from or including secondary protection device 240, such as notification device 250.

As shown in FIG. 4, process 400 may include receiving a voltage surge (block 410). For example, secondary protection device 240 may receive a voltage surge associated with a power source connected to protected equipment 210. In some implementations, secondary protection device 240 may receive the voltage surge when primary protection device 230 fails to protect protected equipment 210 from the voltage surge (e.g., when primary protection device 230 experiences an open failure).

As further shown in FIG. 4, process 400 may include protecting a piece of protected equipment from the voltage surge based on receiving the voltage surge (block 420). For example, secondary protection device 240 may protect protected equipment 210 from the voltage surge based on receiving the voltage surge from the power source associated with protected equipment 210. In some implementations, secondary protection device 240 may protect protected equipment 210 from the voltage surge by diverting the voltage surge to a ground associated with secondary protection device 240 (e.g., a GDT, when receiving the voltage surge, diverts the voltage surge to a ground after associated with the GDT). In some implementations, secondary protection device 240 may protect protected equipment 210 from the voltage surge by clamping the voltage surge (e.g., such that the amount of voltage allowed to pass to protected components 220 is reduced to an acceptable level).

In some implementations, secondary protection device 240 may protect protected equipment 210 from the voltage surge when the voltage surge satisfies a threshold associated with secondary protection device 240. For example, the voltage surge may satisfy a threshold voltage amount (e.g., 2 kV, 2.5 kV, etc.), and secondary protection device 240 (e.g., protection component 310) may protect protected equipment 210 from the voltage surge based on the voltage surge satisfying the threshold voltage amount (e.g., secondary protection device 240 may not protect protected equipment 210 from a voltage surge that does not satisfy the threshold amount). In some implementations, secondary device 220 may protect protected equipment 210 from the voltage surge until the amount of voltage associated with the voltage surge drops below the threshold voltage amount (e.g., until the voltage surge dissipates).

As further shown in FIG. 4, process 400 may include generating a failure notification associated with a primary protection device (block 430). For example, secondary protection device 240 may generate a failure notification associated with primary protection device 230. In some implementations, secondary protection device 240 (e.g., signal component 320) may generate the failure notification based on an electrical signal associated with protecting protected equipment 210 from the voltage surge. For example, secondary protection device 240 may protect protected equipment 210 from the voltage surge (e.g., using a GDT, etc.), and an electrical signal (e.g., an electrical signal resulting from diverting a current, associated with the voltage surge, through protection component 310 included in secondary protection device 240) may be used by secondary protection device 240 (e.g., signal component 220 and/or transmit component 330) to generate a failure notification.

A failure notification may include a notification, associated with secondary protection device 240, that indicates that primary protection device 230 has failed to protect protected equipment 210 from the voltage surge. In some implementations, the failure notification may include information associated with primary protection device 230, such as a string of characters associated with primary protection device 230 (e.g., a serial number associated with primary protection device 230, a name associated with primary protection device 230, etc.), or other information that identifies primary protection device 230. Additionally, or alternatively, the failure notification may include a signal (e.g., an electrical signal associated with powering an available alarm, an LED, etc.), a code (e.g., a code that indicates that primary protection device 230 has failed), or the like. Additionally, or alternatively, the failure notification may include information that indicates that a user (e.g., associated with protected equipment 210) is to replace and/or repair primary protection device 230.

In some implementations, the failure notification may include information that may cause another device (e.g., notification device 250) to output information associated with the failure notification. For example, the failure notification may include information that indicates that notification device 250 is to display a message based on the failure notification (e.g., via a display screen of notification device 250). As another example, the failure notification may include information that causes notification device 250 to output information that indicates that primary protection device 230 has failed (e.g., by causing an LED warning light to illuminate).

As further shown in FIG. 4, process 400 may include providing the failure notification (block 440). For example, secondary protection device 240 may provide the failure notification. In some implementations, secondary protection device 240 may provide the failure notification when secondary protection device 240 generates the failure notification (e.g., after secondary protection device 240 protects protected equipment 210 from the voltage surge). In some implementations, secondary protection device 240 may provide the failure notification to notification device 250. Additionally, or alternatively, secondary protection device 240 may provide the failure notification to another device (e.g., a device associated with a user of protected equipment 210).

Although FIG. 4 shows example blocks of process 400, in some implementations, process 400 may include additional blocks, different blocks, fewer blocks, or differently arranged blocks than those depicted in FIG. 4. Additionally, or alternatively, one or more of the blocks of process 400 may be performed in parallel.

Figure 5A:
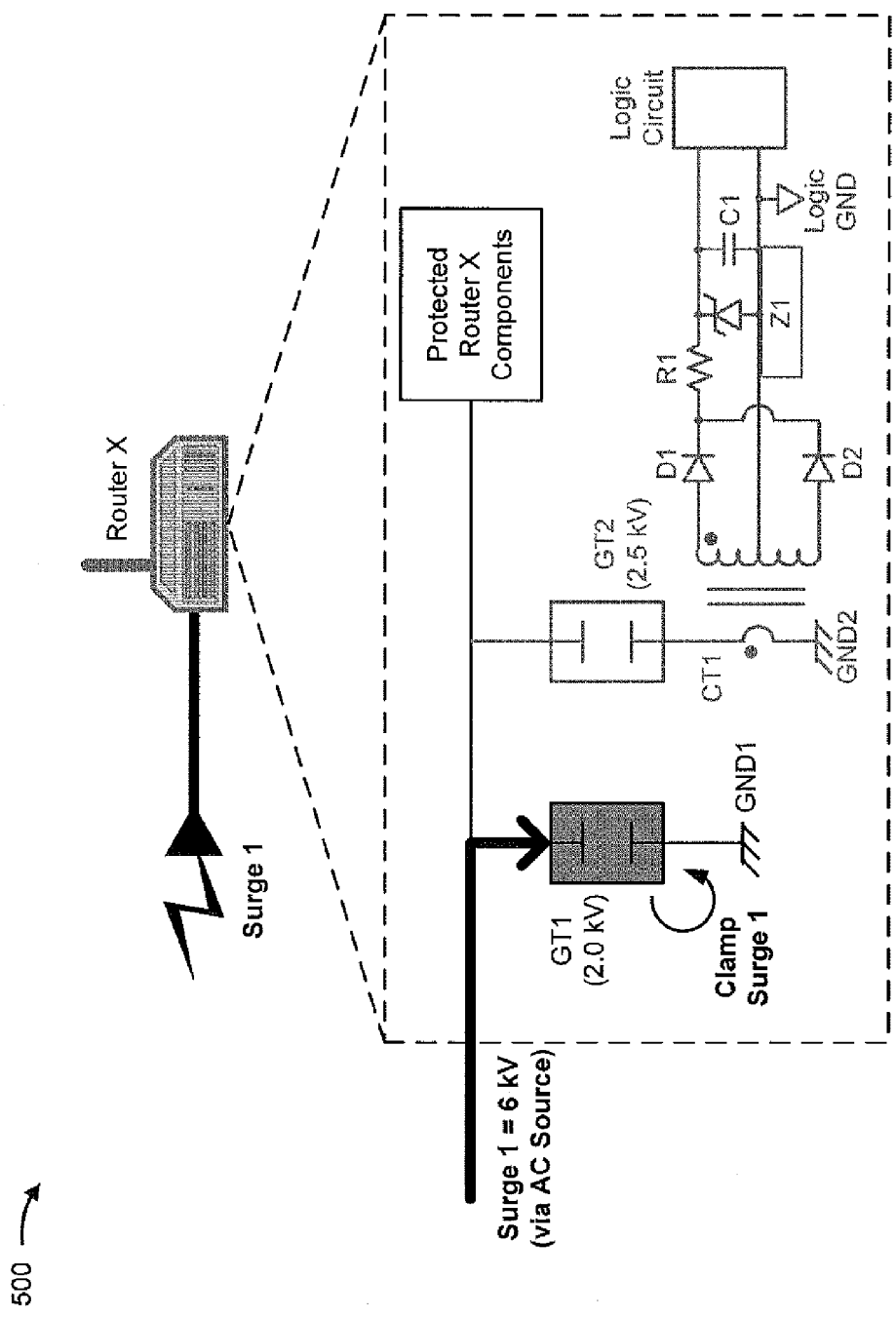
FIGS. 5A-5B are diagrams of an example implementation relating to the example process shown in FIG. 4.
Figure 5B:
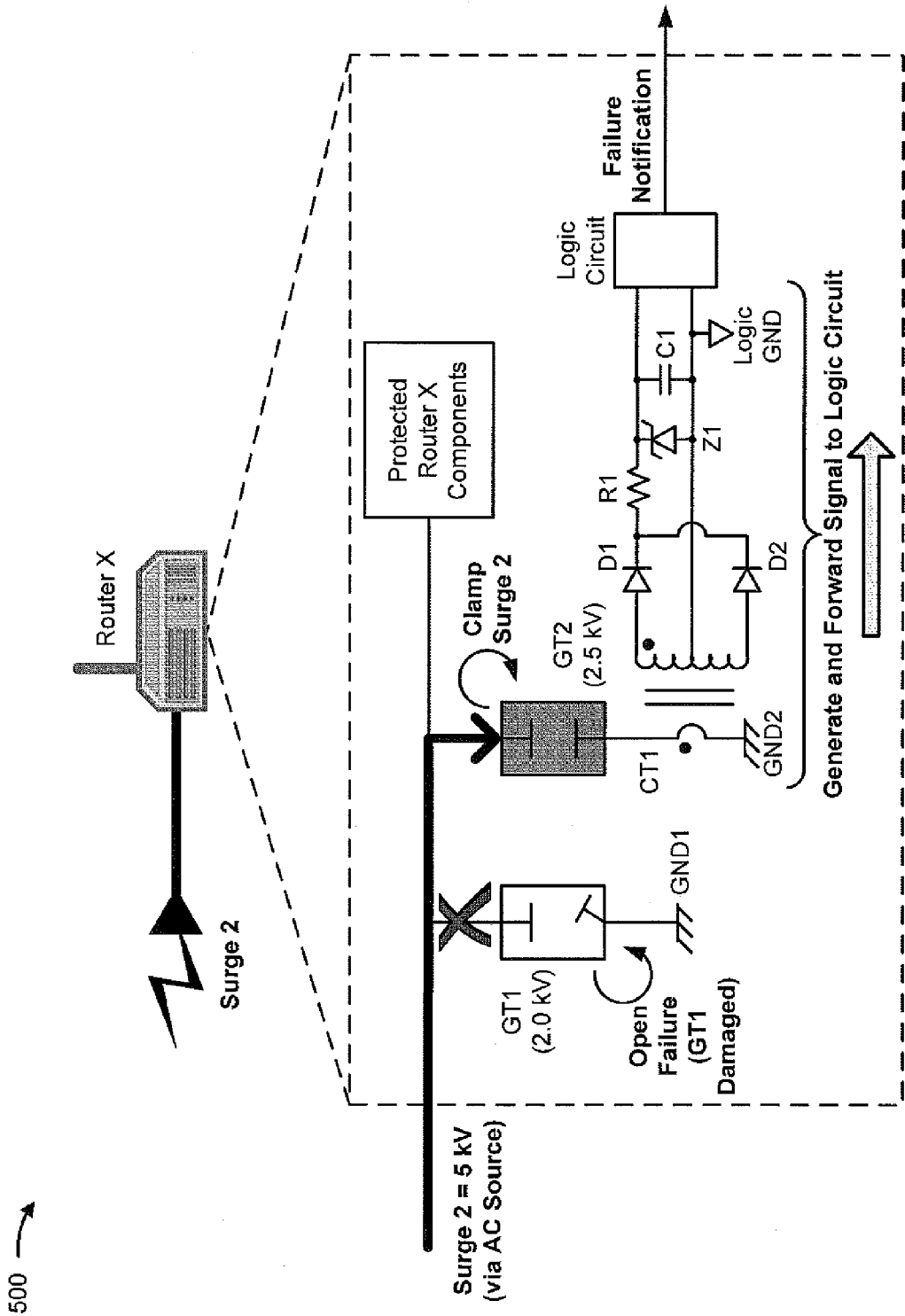

FIGS. 5A-5B are diagrams of an example implementation 500 relating to example process 400 shown in FIG. 4. For the purposes of example implementation 500, assume that a piece of protected equipment, Router X, is connected to an alternating current ("AC") power source, and that Router X contains a primary protection device that includes a protection component, identified as GT1 (e.g., a GDT). Further, assume that Router X contains a secondary protection device that includes a protection component (e.g., GT2), a signal component (e.g., including CT1, D1, D2, R1, Z1, and C1), and a transmit component (e.g., a logic circuit). Finally, assume that the primary protection device and the secondary protection device are to protect Router X from a voltage surge.

As shown in FIG. 5A, Router X may receive a first voltage surge (e.g., surge 1), via the AC power source, with a voltage of 6 kV. As shown, GT1 may have a triggering voltage of 2 kV (e.g., GT1 is to clamp a voltage surge that exceeds 2 kV). As further shown, GT1 may clamp surge 1 (e.g., since 6 kV satisfies the 2 kV threshold of GT1), and may divert surge 1 to a ground (e.g., GND1) associated with GT1. As shown in FIG. 5A, the primary protection device, GT1, is functional, and the secondary protection device (e.g., including GT2, CT1, etc.) is inactive (e.g., no failure notification is generated).

For the purposes of FIG. 5B, assume that GT1 has been damaged (e.g., such that GT1 will not protect the components of Router X from a voltage surge). As shown in FIG. 5B, Router X may receive a second voltage surge (e.g., surge 2), via the AC power source, with a voltage of 5 kV. As shown, GT1 may not protect the components of Router X since GT1 has been damaged (e.g., resulting in a open failure of GT1).

As further shown, GT2 may have a triggering voltage of 2.5 kV (e.g., GT2 is to clamp a voltage surge that exceeds 2.5 kV). As shown, GT2 may clamp surge 2 (e.g., since 5 kV satisfies the 2.5 kV threshold of GT2), and may divert surge 2 to a ground (e.g., GND2) associated with GT2. As further shown, the signal component (e.g., associated with the secondary protection device that includes GT2) that includes a current transformer (e.g., CT1), diodes (e.g., D1, D2, and Z1), a resistor (e.g., R1), and a capacitor (e.g., C1) may generate and forward an electrical signal to a transmit component (e.g., a logic circuit) based on GT2 clamping surge 2 (e.g., when the diverted current, associated with surge 2, causes CT1 to generate a signal that is forwarded to the logic circuit).

As further shown in FIG. 5B, the logic circuit may receive the signal and may generate a failure notification. As further shown, the logic circuit may provide the failure notification (e.g., to warn the user that the primary protection device associated with Router X has experienced an open failure). In this manner, the failure notification may be provided based on GT2 protecting Router X from surge 2 (e.g., the failure notification will be generated only when GT2 is triggered).

As indicated above, FIGS. 5A and 5B are provided merely as an example. Other examples are possible and may differ from what was described with regard to FIGS. 5A and 5B.

FIG. 6 is a flow chart of an example process 600 for receiving and providing a failure notification associated with a primary protection device. In some implementations, one or more process blocks of FIG. 6 may be performed by notification device 250. In some implementations, one or more process blocks of FIG. 6 may be performed by another device or a group of devices separate from or including notification device 250, such as secondary protection device 240.

As shown in FIG. 6, process 600 may include receiving a failure notification associated with a primary protection device (block 610). For example, notification device 250 may receive a failure notification associated with primary protection device 230. In some implementations, notification device 250 may receive the failure notification from secondary protection device 240. In some implementations, notification device 250 may receive the failure notification when secondary protection device 240 generates the failure notification. In some implementations, notification device 250 may receive the failure notification via network 260.

As further shown in FIG. 6, process 600 may include displaying the failure notification (block 620). For example, notification device 250 may display the failure notification. In some implementations, notification device 250 may display the failure notification when notification device 250 receives the failure notification from another device, such as secondary protection device 240. In some implementations, notification device 250 may display the failure notification at particular intervals of time (e.g., every 4 hours, every 30 days, etc.) based on receiving the failure notification.

In some implementations, notification device 250 may display the failure notification by outputting information associated with the failure notification. For example, notification device 250 may display the failure notification by causing a display screen, associated with notification device 250, to display information associated with the failure notification (e.g., in a situation in which notification device 250 may be external to protected equipment 210). As an additional example, notification device 250 may display the failure notification by causing a light source (e.g., an LED) associated with notification device 250, to illuminate based on receiving the failure notification (e.g., in a situation in which notification device 250 may be included in protected equipment 210). In some implementations, notification device 250 may display the failure notification to warn a user, associated with protected equipment 210, that primary protection device has failed. Additionally, or alternatively, notification device 250 may display the failure notification to inform the user that primary protection device 230 is to be repaired and/or replaced.

In some implementations, notification device 250 may display the failure notification by generating and sending (e.g., to another device associated with the user) a message (e.g., an email, a text message, etc.) indicating that primary protection device 230 has failed, is to be replaced, and/or is to be repaired. Additionally, or alternatively, notification device 250 may display the failure notification by playing a sound (e.g., an alarm, a tone, etc.) indicating that primary protection device 230 has failed, is to be replaced, and/or is to be repaired.

Although FIG. 6 shows example blocks of process 600, in some implementations, process 600 may include additional blocks, different blocks, fewer blocks, or differently arranged blocks than those depicted in FIG. 6. Additionally, or alternatively, one or more of the blocks of process 600 may be performed in parallel.

Figure 7:
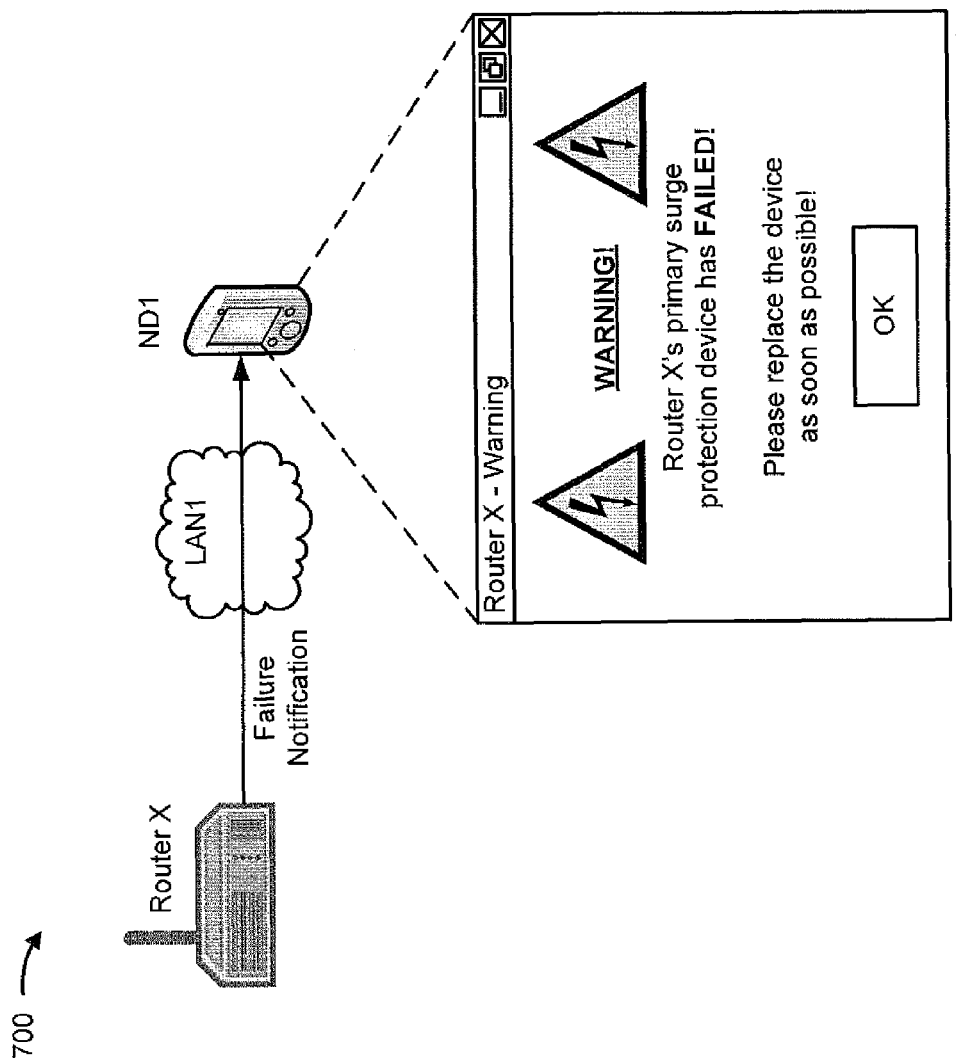
FIG. 7 is a diagram of an example implementation relating to the example process shown in FIG. 6.

FIG. 7 is a diagram of an example implementation 700 relating to example process 600 shown in FIG. 6. For the purposes of example implementation 700, assume that a secondary protection device (e.g., included in Router X) has generated a failure notification, associated with a primary protection device included in Router X, and has provided the failure notification using a network identified as LAN1.

As shown in FIG. 7, a notification device, identified as ND1, may receive the failure notification from Router X (e.g., via LAN1). As further shown, ND1 may display information associated with the failure notification on a display screen associated with ND1. As shown, ND1 may display information indicating that that the primary protection device, associated with Router X, has failed (e.g., "Router X's primary surge protection device has FAILED!"). As further shown, ND1 may also display information indicating that the primary protection device is to be replaced (e.g., "Please replace the device as soon as possible!"). In this manner, ND1 may warn a user, associated with Router X, that the primary protection device has failed, while also providing secondary protection to Router X (e.g., using the secondary protection device).

As indicated above, FIG. 7 is provided merely as an example. Other examples are possible and may differ from what was described with regard to FIG. 7.

Implementations described herein may allow a secondary protection device to provide, to a user associated with a piece of protected equipment, information indicating a failure of a primary protection device associated with the protected equipment.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, or a combination of hardware and software.

Some implementations are described herein in conjunction with thresholds. The term "greater than" (or similar terms), as used herein to describe a relationship of a value to a threshold, may be used interchangeably with the term "greater than or equal to" (or similar terms). Similarly, the term "less than" (or similar terms), as used herein to describe a relationship of a value to a threshold, may be used interchangeably with the term "less than or equal to" (or similar terms). As used herein, "satisfying" a threshold (or similar terms) may be used interchangeably with "being greater than a threshold," "being greater than or equal to a threshold," "being less than a threshold," "being less than or equal to a threshold," or other similar terms.

Certain user interfaces have been described herein. In some implementations, the user interfaces may be customizable by a device or a user. Additionally, or alternatively, the user interfaces may be pre-configured to a standard configuration, a specific configuration based on a type of device on which the user interfaces are displayed, or a set of configurations based on capabilities and/or specifications associated with a device on which the user interfaces are displayed.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Where only one item is intended, the term "one" or similar language is used. Further, the phrase "based on" is intended to mean "based, at least in part, on" unless explicitly stated otherwise.

What is claimed is:

1. A secondary protection device, comprising:
one or more components, implemented at least partially in hardware, to:
receive a voltage surge,
the voltage surge being received based on a failure associated with a primary protection device;
protect a piece of protected equipment from the voltage surge based on receiving the voltage surge;
generate a failure notification based on an electrical current that results from the secondary protection device protecting the piece of protected equipment from the voltage surge,
the failure notification indicating the failure associated with the primary protection device; and
provide the failure notification.

2. The secondary protection device of claim 1, where the one or more components are further to:
detect that an amount of voltage, associated with the voltage surge, satisfies a threshold amount of voltage; and
where the one or more components, when protecting the piece of protected equipment from the voltage surge, are to:
protect the piece of protected equipment based on detecting that the amount of voltage satisfies the threshold amount of voltage.

3. The secondary protection device of claim 1, where the one or more components, when protecting the piece of protected equipment from the voltage surge, are to:
protect the piece of protected equipment from the voltage surge using a gas discharge tube associated with secondary protection device.

4. The secondary protection device of claim 1, where the one or more components, when protecting the piece of protected equipment, are to:
divert the electrical current to a ground.

5. The secondary protection device of claim 1, where the one or more components are further to:
generate an electrical signal based on protecting the piece of protected equipment from the voltage surge; and
where the one or more components, when generating the failure notification, are to:
generate the failure notification based on the electrical signal.

6. The secondary protection device of claim 1, where the failure notification includes at least one of:
information that identifies the primary protection device;
information that indicates that the primary protection device has failed;
information that indicates that the primary protection device is to be replaced; or
information that indicates that the primary protection device is to be repaired.

7. The secondary protection device of claim 1, where the one or more components, when providing the failure notification, are to:
provide the failure notification to a notification device associated with the secondary protection device,
the notification device including a device that is to provide an audible or visual output associated with the failure notification.

8. A method, comprising:
detecting, by a secondary protection device, a voltage surge,
the voltage surge being detected based on a failure associated with a primary protection device;

protecting, by the secondary protection device, one or more protected components from the voltage surge;

generating, by the secondary protection device and based on an electrical current, a failure notification based on protecting the one or more protected components, the electrical current resulting from the secondary protection device protecting the one or more protected components, and the failure notification including information that indicates that the primary protection device has failed; and outputting, by the secondary protection device, the failure notification.

9. The method of claim 8, further comprising:

detecting that an amount of voltage, associated with the voltage surge, satisfies a threshold amount of voltage; and where protecting the one or more protected components from the voltage surge comprises:

protecting the one or more protected components based on detecting that the amount of voltage satisfies the threshold amount of voltage.

10. The method of claim 8, where protecting the one or more protected components from the voltage surge comprises:

protecting the one or more protected components using a gas discharge tube.

11. The method of claim 8, where protecting the one or more protected components from the voltage surge comprises:

diverting the electrical current to a ground.

12. The method of claim 8, further comprising:

generating an electrical signal based on protecting the one or more protected components; and where generating the failure notification comprises:

generating the failure notification based on the electrical signal.

13. The method of claim 8, where the failure notification includes at least one of:

information that identifies the primary protection device;

information that indicates that the primary protection device has failed;

information that indicates that the primary protection device is to be replaced; or information that indicates that the primary protection device is to be repaired.

14. The method of claim 8, where outputting the failure notification comprises:

outputting the failure notification to a notification device, the notification device including a device that is to provide an audible or visual output associated with the failure notification.

15. A system, comprising:

a primary protection device; and a secondary protection device to:

receive a surge event based on a failure associated with the primary protection device;

protect a group of protected components from the surge event based on receiving the surge event;

produce a failure notification based on an electrical current resulting from the secondary protection device protecting the group of protected components, the failure notification including information indicating the failure associated with the primary protection device; and provide a visual or audible output associated with the failure notification, the visual or audible output being provided to a user associated with the primary protection device.

16. The system of claim 15, where the secondary protection device is further to:

detect that an amount of voltage, associated with the surge event, satisfies a threshold amount of voltage; and where the secondary protection device, when protecting the group of protected components, is further to:

protect the group of protected components based on detecting that the amount of voltage satisfies the threshold amount of voltage.

17. The system of claim 15, where the secondary protection device, when protecting the group of protected components from the surge event, is to:

protect the group of protected components from the surge event using a gas discharge tube.

18. The system of claim 15, where the secondary protection device, when protecting the group of protected components, is to:

divert the electrical current to a ground.

19. The system of claim 15, where the secondary protection device is further to:

generate an electrical signal based on protecting the group of protected components; and where the secondary protection device, when producing the failure notification, is to:

produce the failure notification based on the electrical signal.

20. The system of claim 15, where the failure notification includes at least one of:

information that identifies the primary protection device;

information that indicates that the primary protection device has failed;

information that indicates that the primary protection device is to be replaced; or information that indicates that the primary protection device is to be repaired.

* * * * *